(12) United States Patent
Balan et al.

(10) Patent No.: US 10,083,852 B1
(45) Date of Patent: Sep. 25, 2018

(54) FLOATING WAFER CHUCK

(71) Applicant: KLA-Tencor Corporation, Milpitas, CA (US)

(72) Inventors: Aviv Balan, Mountain View, CA (US); Vaibhaw Vishal, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/652,659

(22) Filed: Jul. 18, 2017

Related U.S. Application Data

(60) Provisional application No. 62/505,248, filed on May 12, 2017.

(51) Int. Cl.
 *H01L 21/68* (2006.01)
 *H01L 21/687* (2006.01)
 *H01L 21/67* (2006.01)

(52) U.S. Cl.
 CPC .. *H01L 21/68721* (2013.01); *H01L 21/67017* (2013.01); *H01L 21/68735* (2013.01); *H01L 21/68757* (2013.01)

(58) Field of Classification Search
 CPC ......... H01L 21/68721; H01L 21/68728; H01L 21/68735; H01L 21/68757

IPC .............. H01L 21/68721,21/68728, 21/68735, 21/68757
 See application file for complete search history.

(56) References Cited

U.S. PATENT DOCUMENTS

| | | | |
|---|---|---|---|
| 7,607,647 B2 | 10/2009 | Zhao et al. | |
| 2002/0066475 A1* | 6/2002 | Verhaverbeke | B25B 5/06 |
| | | | 134/153 |
| 2004/0180141 A1* | 9/2004 | Kobayashi | B05D 1/005 |
| | | | 427/240 |
| 2005/0031497 A1* | 2/2005 | Siebert | H01L 21/68707 |
| | | | 279/4.12 |
| 2006/0046396 A1* | 3/2006 | Harless | H01L 21/68728 |
| | | | 438/270 |
| 2015/0179495 A1* | 6/2015 | Huang | H01L 21/6838 |
| | | | 356/237.5 |
| 2017/0372937 A1* | 12/2017 | Keigler | C25D 17/001 |

* cited by examiner

*Primary Examiner* — Julia Slutsker
(74) *Attorney, Agent, or Firm* — Hodgson Russ LLP

(57) ABSTRACT

Edge grippers are disposed around an outer edge of a chuck. Each of the edge grippers includes a finger configured to pivot around a point; a contact pad configured to contact the wafer; and a flexure disposed between the contact pad and the finger. The flexure is configured to flex toward and away from the chuck. The chuck can use a matrix of vacuum and pressure nozzles designed to keep a wafer floating above the chuck. The edge grippers can hold the wafer at the edge while minimizing deformation of the wafer or without affecting z-jitter of the wafer.

14 Claims, 5 Drawing Sheets

FLOATING WAFER CHUCK

CROSS-REFERENCE TO RELATED APPLICATIONS

This application claims priority to the provisional patent application filed May 12, 2017 and assigned U.S. App. No. 62/505,248, the disclosure of which is hereby incorporated by reference.

FIELD OF THE DISCLOSURE

This disclosure relates to wafer handling.

BACKGROUND OF THE DISCLOSURE

Fabricating semiconductor devices, such as logic and memory devices, typically includes processing a substrate like a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Both sides of a wafer can be inspected during semiconductor manufacturing. To inspect the backside of a wafer, the wafer is generally held such that it does not damage or contaminate the top surface of wafer where devices will be made. A non-contact chuck with edge grippers can be used to hold the wafer during backside inspection. The backside surface under inspection needs to be held flat under the optical system's field of view. The restrictions on the allowed slope of wafer surface can be stringent, such as being on the order of approximately 100 μrad.

Various forces contribute to undesirable slope of the wafer surface. These forces include deformation due to gravity, pre-existing wafer warp, and the forces caused by the edge grippers. Such forces can exacerbate the slope of a wafer that was already warped prior to chucking. Thus, the edge grippers can negatively affect inspection of the backside of the wafer by worsening wafer slope. Edge grippers can exacerbate these problems even more during wafer spinning. Furthermore, wafers of different warps cannot be flattened reliably. More complex warp shapes cannot be flattened using previous techniques. Therefore, what is needed are improved chucks for hold wafers.

BRIEF SUMMARY OF THE DISCLOSURE

In a first embodiment, an apparatus is provided. The apparatus comprises a chuck and a plurality of edge grippers. The chuck has a surface with a plurality of gas flow openings configured to provide a flow of gas. The surface of the chuck is in a plane perpendicular to a vertical direction. The edge grippers are disposed around an outer edge of the chuck. Each of the edge grippers includes: a finger configured to pivot around a point; a contact pad configured to contact a wafer; and a flexure disposed between the contact pad and the finger. The flexure is configured to flex toward and away from the chuck in the vertical direction. An actuator is connected to at least one of the edge grippers. In an instance, three of the edge grippers are disposed around the outer edge of the chuck.

The edge grippers can be configured to prevent the wafer from rotating in a direction perpendicular to the vertical direction. For example, the chuck can be configured to spin the wafer up to 6,000 rpm.

The actuator can be a magnetic drive configured to cause the finger to pivot around the point.

The contact pad can be fabricated of a perfluoroelastomer or polyether ether ketone.

In an instance, one of the edge grippers is configured to push against a remainder of the edge grippers.

The contact pad can have a planar surface disposed on the wafer.

The edge grippers can be disposed uniformly around the outer edge of the chuck.

The finger may be fabricated of aluminum, plastic, or steel. The flexure may be fabricated of aluminum, steel, or a hard plastic.

Each of the edge grippers can include a spring. The spring can be configured to provide a force to the contact pad parallel to the surface of the chuck.

The chuck can defines a plurality of recesses. One of the edge grippers may be disposed in each of the recesses.

In a second embodiment, a method is provided. A wafer is floated above a chuck on an air-vacuum film between a surface of the chuck and the wafer. The surface of the chuck is in a plane perpendicular to a vertical direction. The wafer is contacted with a plurality of edge grippers. Each of the edge grippers includes: a finger configured to pivot around a point; a contact pad configured to contact a wafer; and a flexure disposed between the contact pad and the finger. The flexure is configured to flex toward and away from the chuck in the vertical direction. The wafer may be spun at a rate up to 6,000 rpm using the chuck.

In an instance, only one of the edge grippers may push the wafer against a remainder of the edge grippers. In another instance, all of the edge grippers may be actuated to push the wafer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of a chuck disclosed herein use a matrix of vacuum and pressure nozzles designed to keep a wafer floating (e.g., hovering) a few microns above the chuck with low jitter. An edge grip system that includes multiple edge grippers with flexures is attached to the chuck. The edge grippers can hold the wafer edge while minimizing deformation of the wafer or without affecting z-jitter of the wafer.

Figure 1:
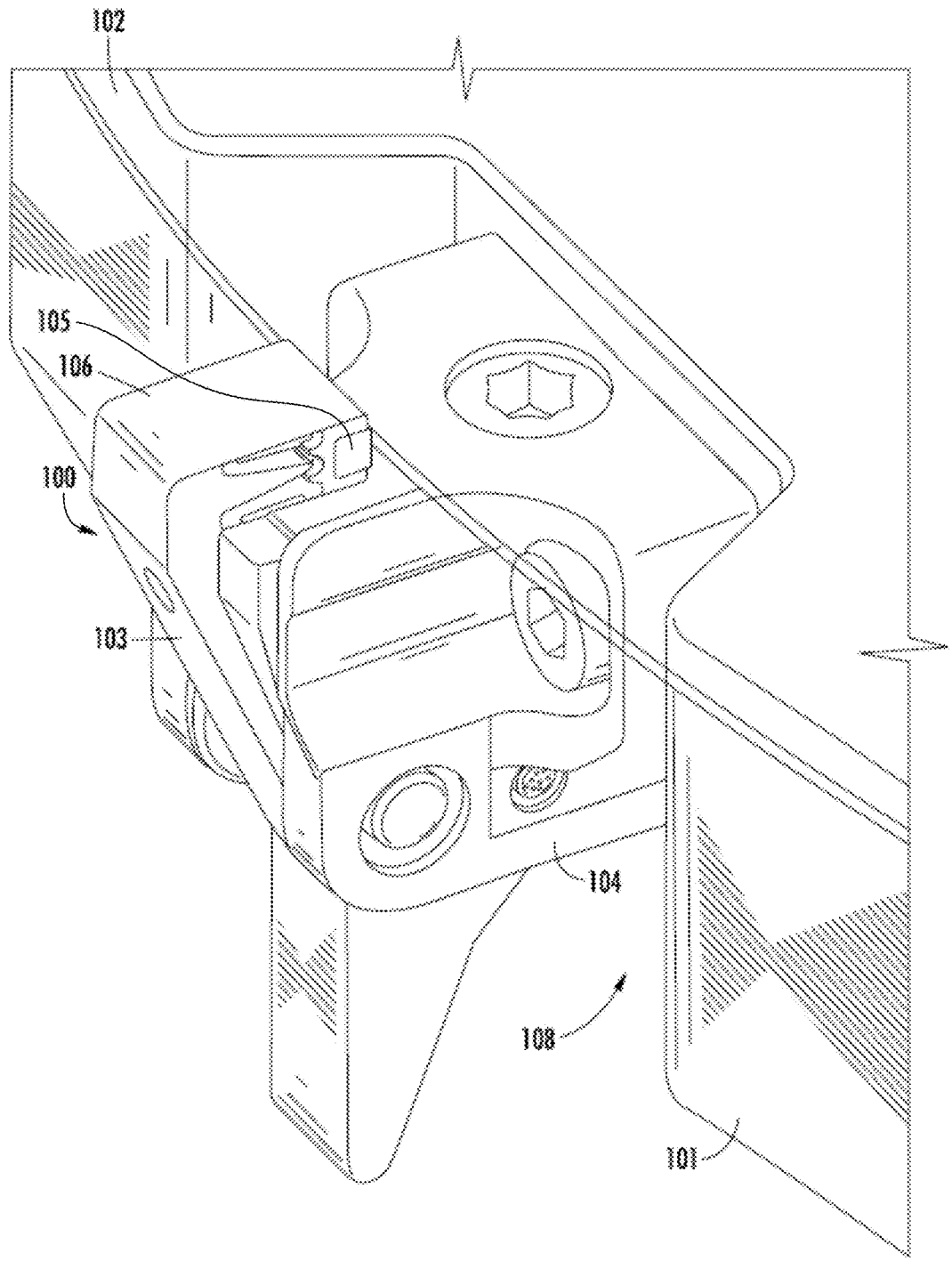
FIG. 1 is a perspective view of an edge gripper in accordance with the present disclosure.
Figure 2:
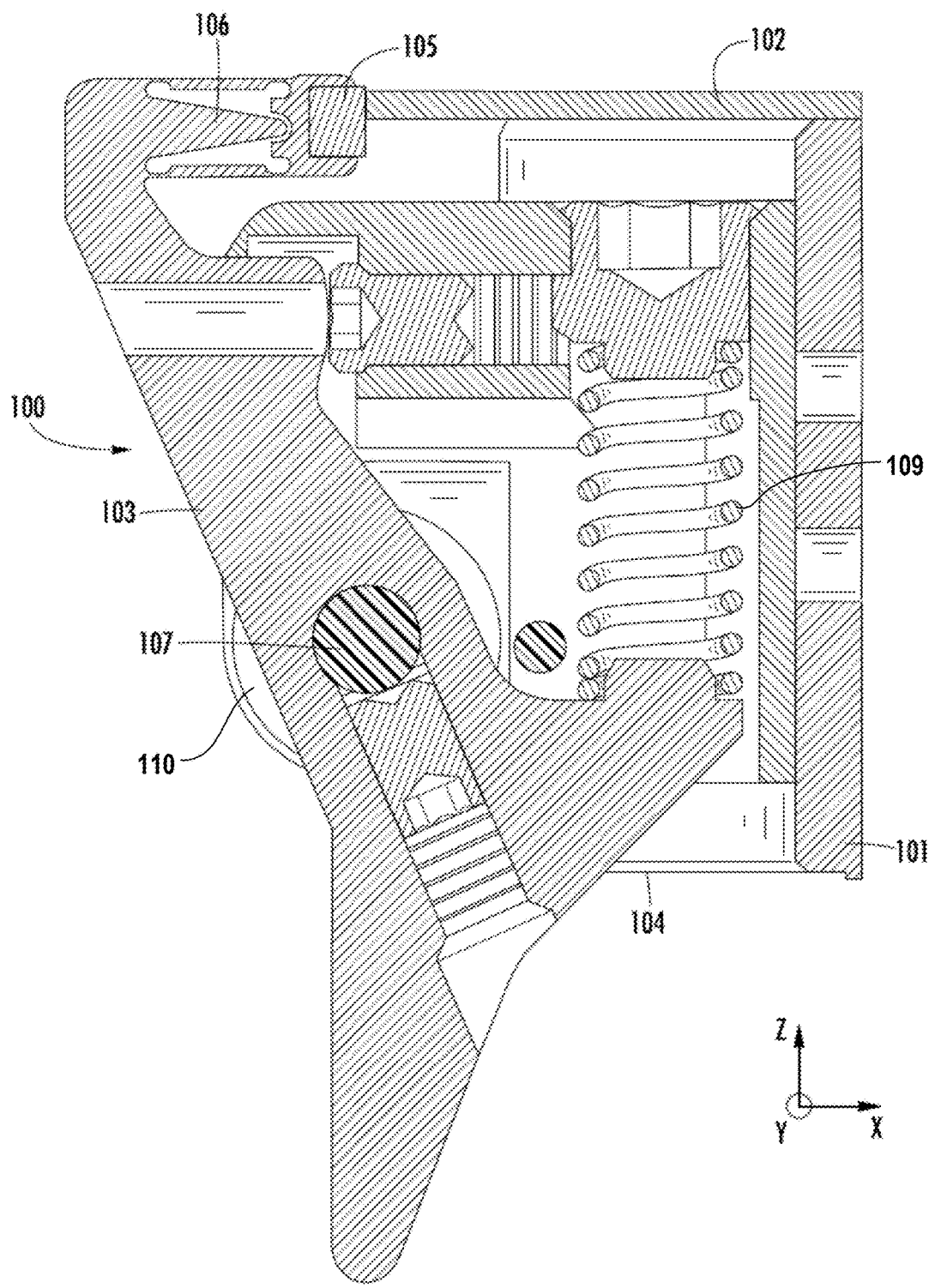
FIG. 2 is a cross-sectional view of the embodiment of FIG. 1.

FIG. 1 is a perspective view of an edge gripper 100 and FIG. 2 is a cross-sectional view of the embodiment of FIG. 1. The edge gripper 100 is connected with a chuck 101. The chuck 101 can have flow openings (not illustrated) configured to provide a flow of gas. The flow openings may be positioned in a surface of the chuck 101. The surface of the chuck 101 may be in a plane perpendicular to a vertical direction (e.g., Z-direction). A wafer 102, such as a 300 mm wafer, is positioned above the chuck 101. The wafer 102 can be both held by the edge gripper 100 and float above the chuck 101 using the flow of gas.

The chuck 101 can work like an air bearing and can flatten non-flat wafers on the chuck 101 due to the presence of a thin (e.g., approximately 5-30 μm) stiff air-vacuum film between the wafer 102 and the chuck 101. The chuck 101 surface does not touch the wafer, so surface damage to the wafer 102 is not a concern.

As seen in FIG. 1, the edge gripper 100 is positioned in a recess 108 of the chuck 101. The volume of this recess 108 may be configured so as to not exceedingly affect the surface area of the chuck 101 and the space for available gas flow. However, the volume of this recess 108 also may be configured to enable an acceptable connection between the chuck 101 and the edge gripper 100.

The edge gripper 100 includes a finger 103 that is configured to pivot relative a point inside the body 104. For example, the finger 103 can pivot around a pin 107. The finger 103 can be fabricated of any suitable materials, such as aluminum, plastic, steel, or other metals. A pivot pin bushing 110 can be used to attach the finger 103 to the body 104, which is attached to the chuck 101. The finger 103 may have a width dimension (e.g., the Y-direction) from approximately 3-10 mm, but a larger finger 103 can also be used.

The edge gripper 100 also includes a contact pad 105 configured to contact the wafer 102. The contact pad 105 may be fabricated of a perfluoroelastomer (e.g., Kalrez® manufactured by DuPont), polyether ether ketone (PEEK), or another material that reduces contamination of the wafer 102, such as contamination caused by particles. The contact pad 105 can be machined as part of the finger 103 or flexure 106. The contact pad 105 also can be attached to the finger 103 or flexure 106 using an adhesive or fasteners.

A flexure 106 can be disposed between the contact pad 105 and the finger 103. The flexure 106 can be configured to flex toward and/or away from the chuck 101 (e.g., along the Z-axis). For example, this may be parallel to flow of gas out of the gas flow openings. A soft flexure 106 can minimize or prevent vertical (Z-axis) deformation of the wafer 102. The geometry of the flexure 106 can be configured to provide low stiffness for deformation in Z-direction. The flexure 106 can be fabricated of any material that can be precisely machined such as aluminum, steel, hard plastics, or other metals.

The contact pad 105 or the contact pad 105 in conjunction with the flexure 106 can provide sufficient holding force so that wafer 102 can be spun quickly without slipping. The spring 109 shown in FIG. 2 can ensure that there is enough horizontal force applied on the wafer 102 edge to hold the wafer 102. In an instance, the spring 109 can be configured to provide a force to the contact pad 105 parallel to the surface of the chuck. Friction force available due to this gripping force can ensure that the wafer 102 does not slip when wafer spinning is started or stopped.

While illustrated as planar, the contact pad 105 also can be notched or have other shapes for gripping a wafer 102 during particular applications. For example, the contact pad 105 can be v-shaped. Furthermore, other flexure 106 designs are possible. For example, the contact pad 105 can touch the top and bottom surface of the wafer 102 or on an angle at the wafer edge. The various designs of the contact pad 105 or flexure 106 can hold the wafer 102 securely without applying excessive force in the Z-direction.

The flexure 106 and/or finger 103 may be thin. Thus, the area of the flexure 106 and/or finger 103 may be minimized in the X-direction or Y-direction. There may be limited headroom above the wafer 102 due to the presence of optics.

An actuator can be connected to the edge gripper. Such an actuator may be positioned inside the body 104. For example, a magnetic drive may be positioned inside the body 104.

The edge gripper 100 can provide benefits during wafer processing. Jitter of the wafer 102 may be reduced or kept low, such as under 50 nm. The wafer 102 may be kept from rotating or moving relative to the chuck 101. If the wafer 102 is not flat, it can be flattened by the chuck 101 and edge gripper 100 because an air-vacuum film between wafer 102 and chuck 101 can have a high stiffness. Besides potentially holding the wafer 102 in place, vertical forces (i.e., in the Z-direction) on the wafer 102 can be reduced or eliminated by using the edge gripper 100.

Figure 3:
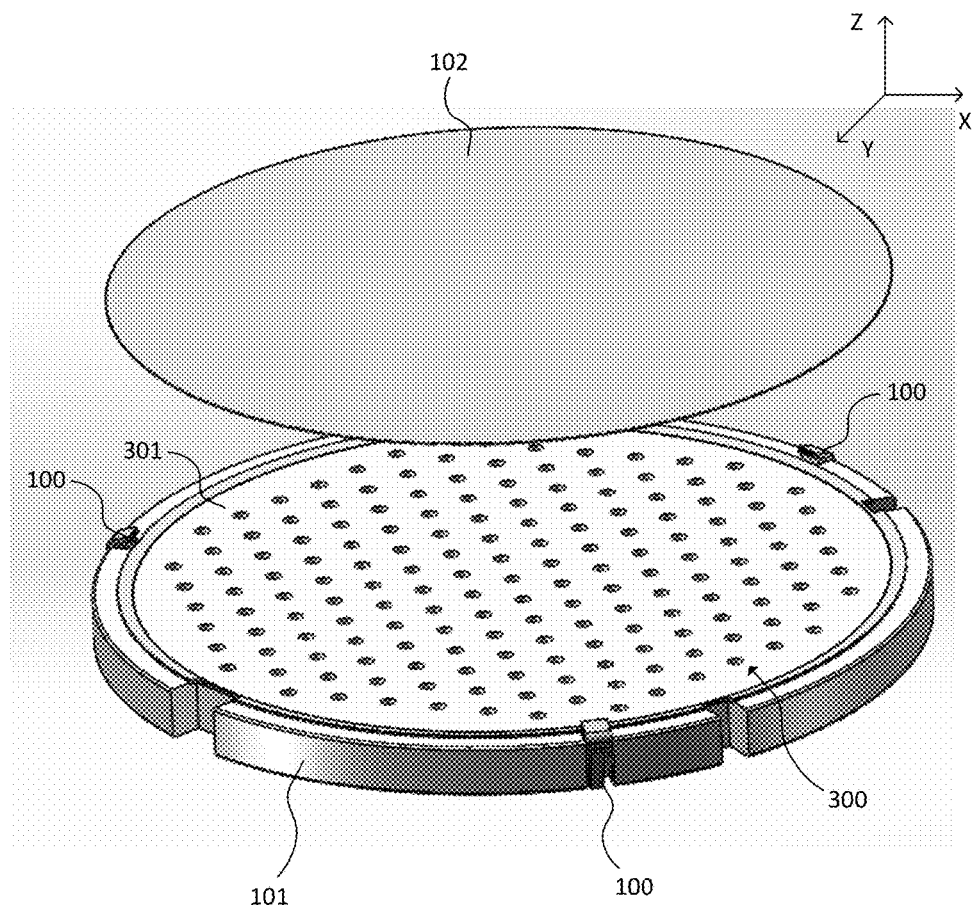
FIG. 3 is a perspective view of an exemplary floating wafer chuck with edge grippers.

FIG. 3 is a perspective view of an exemplary floating wafer chuck 101 with edge grippers 100. While edge grippers 100 are illustrated, other edge gripper designs can be used.

Three edge grippers 100 are illustrated in FIG. 3, but other numbers of edge grippers are possible. For example, more than three edge grippers 100 may be used. In an instance, between three and six edge grippers 100 may be used. The edge grippers 100 may or may not be distributed uniformly around a circumference of a wafer.

As seen in FIG. 3, the chuck 101 includes multiple flow openings 300 configured to provide a flow of gas. The flow opening 300 are formed in a surface 301 of the chuck 100 and may be in fluid communication with a gas (e.g., clean dry air) source and/or a vacuum source. The surface 301 of the chuck 101 may be in a plane perpendicular to a vertical direction (e.g., Z-direction in FIG. 2). An example of a chuck with flow openings is found in U.S. Pat. No. 7,607,647, which is incorporated by reference. The internals of chuck 101 can include of labyrinth of channels that deliver vacuum and pressurized air on the surface 301 of chuck 101. The flow openings 300 in the surface 301 can provide uniform distribution of pressurized air and vacuum underneath the wafer 102. The air-vacuum film formed between the surface 301 and the wafer 102 can be stiff, stable, and of uniform thickness.

Use of chuck 100 with gas flow through the flow openings 300 in conjunction with the edge grippers 100 can enable the wafer 102 to be chucked for wafer inspection applications, including those that require low wafer jitter.

Each edge gripper 100 can push the wafer 102 with a small amount of horizontal force. The flexure construction in the edge grippers 100 and contact pads can provide small or zero vertical forces on the wafer 102, thereby resulting in negligible slope of wafer 102 near the edge grippers 100.

The width (in the X-Y plan) of the flexure, contact pad, and/or finger of the edge grippers 100 may be minimized so that the edge grippers 100 do not cover a surface of the wafer 102 during inspection.

In an embodiment, two of the three edge grippers 100 may be positioned in a stopped or locked position. The third of the three edge grippers 100 can push the wafer 102 against the other two edge grippers 102 that are stopped or locked. The edge grippers 100 may apply enough force so that a wafer can be secured for spinning. In an example, a value for horizontal force would be approximately 0.1 lbf to 10 lbf.

In another embodiment, all edge grippers 100 are actuated to push the wafer 102. The operation of the edge grippers 100 may be simultaneous, but also may be sequential. In an example, a value for horizontal force would be approximately 0.1 lbf to 10 lbf.

Use of the edge grippers 100 and the chuck 101 can provide sufficient holding force so that the wafer 102 can be spun at, for example, from 100 to 6,000 rpm (e.g., around the Z axis). The chuck 101 is spun using motors and since the edge grippers 100 hold the wafer 102, the wafer 102 can spin with the chuck 101 without any relative slip between the two.

Use of the edge grippers 100 and the chuck 101 also means that the wafer 102 does not deform excessively in the vertical direction (Z-direction) and is not contaminated by components in contact with the wafer 102.

In an instance, the wafer 102 flies above the surface 301 of the chuck 101 by a height (Z-direction) from 5 µm to 30 µm, such as from 7 µm to 30 µm. Other heights are possible. The height may depend on pressure and vacuum level.

Figure 4:
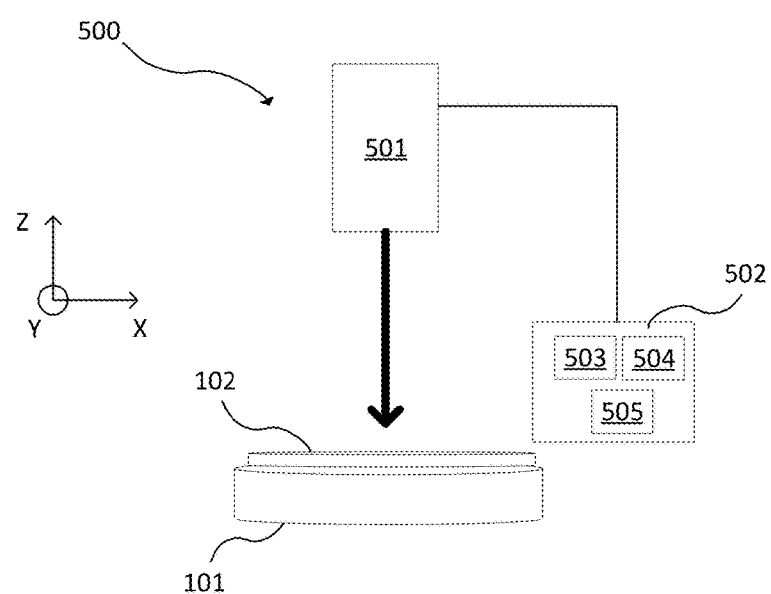
FIG. 4 is a block diagram of an embodiment of a system in accordance with the present disclosure.

FIG. 4 is a block diagram of an embodiment of a system 500. The system 500 includes a chuck 101 configured to hold a wafer 102 or other workpiece. The chuck 101 may be configured to move or rotate in one, two, or three axes. The chuck 101 also may be configured to spin, such as around the Z-axis. While not illustrated, the chuck 101 can include edge grippers, such as the edge grippers of FIGS. 1-2. Thus, the chuck 101 may be, for example, the chuck 101 illustrated in FIG. 3.

The system 500 also includes a measurement system 501 configured to measure a surface of the wafer 102. The measurement system 501 may produce a beam of light, a beam of electrons, broad band plasma, or may use other techniques to measure a surface of the wafer 102.

The system 500 communicates with a controller 502. For example, the controller 502 can communicate with the measurement system 501 or other components of the system 500. The controller 502 can include a processor 503, an electronic data storage unit 504 in electronic communication with the processor 503, and a communication port 505 in electronic communication with the processor 503. It is to be appreciated that the controller 502 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 502 to implement various methods and functions may be stored in controller readable storage media, such as a memory in the electronic data storage unit 504, within the controller 502, external to the controller 502, or combinations thereof.

The controller 502 may be coupled to the components of the system 500 in any suitable manner (e.g., via one or more transmission media, which may include "wired" and/or "wireless" transmission media) such that the controller 502 can receive the output generated by the system 500, such as output from the measurement system 501. The controller 502 may be configured to perform a number of functions using the output. For instance, the controller 502 may be configured to perform an inspection of the backside of the wafer 102. In another example, the controller 502 may be configured to send the output to an electronic data storage unit 504 or another storage medium without performing defect review on the output. The controller 502 may be further configured as described herein.

The controller 502, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The controller 502 may be configured according to any of the embodiments described herein. For example, the controller 502 may be programmed to perform some or all of the steps of FIG. 5.

The system 500 may be part of a defect review system, an inspection system, a metrology system, or some other type of system. Thus, the embodiments disclosed herein describe some configurations that can be tailored in a number of manners for systems having different capabilities that are more or less suitable for different applications.

Figure 5:
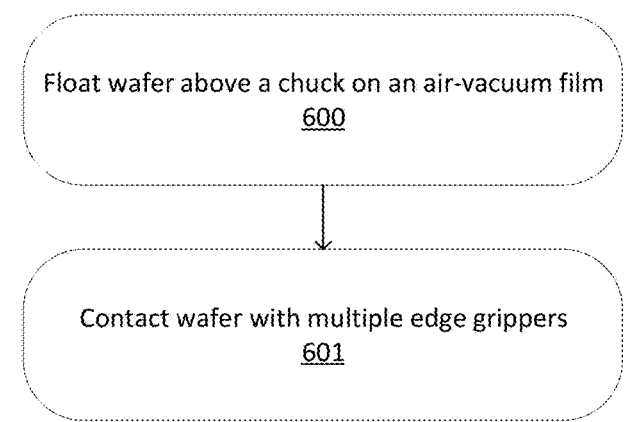
FIG. 5 is a flowchart of an embodiment of a method in accordance with the present disclosure.

FIG. 5 is a flowchart of an embodiment of a method. At 600, a wafer is floated above a chuck on an air-vacuum film between a surface of the chuck and the wafer. The air-vacuum film may be generated by the chuck. The wafer is contacted with a plurality of edge grippers. For example, the edge grippers may be that of FIGS. 1-2. In an instance, only one of the edge grippers is actuated to push the wafer against a remainder of the edge grippers. In another instance, all of the edge grippers are actuated to push the wafer. The wafer may be spun at a rate up to 6,000 rpm using the chuck.

In an instance, the wafer may be lowered onto the air-vacuum film by a wafer handling device and then the edge grippers are actuated after the wafer is floated above the chuck. In another instance, the wafer may be lowered by the wafer handling device and the edge grippers are actuated to push the wafer. Then the air-vacuum film is generated by the chuck.

As used throughout the present disclosure, a "wafer" may refer to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art, such as, but not limited to, isolation layers, implantation layers, and the like. The term "wafer" as used herein is intended to encompass a substrate on which any of such layers may be formed.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
   a chuck having a surface with a plurality of gas flow openings configured to provide a flow of gas, wherein the surface of the chuck is in a plane perpendicular to a vertical direction;
   a plurality of edge grippers disposed around an outer edge of the chuck, wherein one of the edge grippers is configured to push against a remainder of the edge grippers, and wherein each of the edge grippers includes:
     a finger configured to pivot around a point;
     a contact pad configured to contact a wafer; and
     a flexure disposed between the contact pad and the finger, wherein the flexure is configured to flex toward and away from the chuck in the vertical direction; and
   an actuator connected to at least one of the edge grippers.

2. The apparatus of claim 1, wherein the edge grippers are configured to prevent the wafer from rotating in a direction perpendicular to the vertical direction.

3. The apparatus of claim 2, wherein the chuck is configured to spin the wafer up to 6,000 rpm.

4. The apparatus of claim 1, wherein the actuator is a magnetic drive configured to cause the finger to pivot around the point.

5. The apparatus of claim 1, wherein the contact pad is fabricated of a perfluoroelastomer or polyether ether ketone.

6. The apparatus of claim 1, wherein three of the edge grippers are disposed around the outer edge of the chuck.

7. The apparatus of claim 1, wherein the contact pad has a planar surface disposed on the wafer.

8. The apparatus of claim 1, wherein the plurality of edge grippers are disposed uniformly around the outer edge of the chuck.

9. The apparatus of claim 1, wherein the finger is fabricated of aluminum, plastic, or steel.

10. The apparatus of claim 1, wherein the flexure is fabricated of aluminum, steel, or a plastic.

11. The apparatus of claim 1, wherein each of the edge grippers further includes a spring, and wherein the spring is configured to provide a force to the contact pad parallel to the surface of the chuck.

12. The apparatus of claim 1, wherein the chuck defines a plurality of recesses, and wherein one of the edge grippers is disposed in each of the recesses.

13. A method comprising:
   floating a wafer above a chuck on an air-vacuum film between a surface of the chuck and the wafer, wherein the surface of the chuck is in a plane perpendicular to a vertical direction;
   contacting the wafer with a plurality of edge grippers, wherein each of the edge grippers includes:
     a finger configured to pivot around a point;
     a contact pad configured to contact a wafer; and
     a flexure disposed between the contact pad and the finger, wherein the flexure is configured to flex toward and away from the chuck in the vertical direction; and
   actuating only one of the edge grippers to push the wafer against a remainder of the edge grippers.

14. The method of claim 13, further comprising spinning the wafer at a rate up to 6,000 rpm using the chuck.

* * * * *